United States Patent
Nguyen

(10) Patent No.: US 7,054,344 B1
(45) Date of Patent: May 30, 2006

(54) METHOD AND SYSTEM FOR EQUALIZING TRANSMISSION LINE LOSS OF A LASER DRIVE SIGNAL

(75) Inventor: Thé-Linh Nguyen, San Jose, CA (US)

(73) Assignee: Finisar Corporation, Sunnyvale, CA (US)

(*) Notice: Subject to any disclaimer, the term of this patent is extended or adjusted under 35 U.S.C. 154(b) by 358 days.

(21) Appl. No.: 10/716,745

(22) Filed: Nov. 17, 2003

(51) Int. Cl.
H01S 3/00 (2006.01)
(52) U.S. Cl. .................. 372/38.02; 372/38.08
(58) Field of Classification Search ............ 372/34, 372/29.02, 25, 29.01, 29.015, 33, 29.016, 372/38.02
See application file for complete search history.

(56) References Cited

U.S. PATENT DOCUMENTS

| | | | |
|---|---|---|---|
| 4,359,553 A | 11/1982 | Edwards | |
| 4,378,451 A | 3/1983 | Edwards | |
| 4,709,370 A * | 11/1987 | Bednarz et al. | 372/38.02 |
| 5,019,769 A | 5/1991 | Levinson et al. | |
| 5,024,535 A | 6/1991 | Winston, Jr. et al. | |
| 5,041,491 A | 8/1991 | Turke et al. | |
| 5,281,516 A | 1/1994 | Stapleton et al. | |
| 5,327,451 A * | 7/1994 | Walker et al. | 372/98 |
| 5,516,563 A | 5/1996 | Schumann et al. | |
| 5,604,758 A | 2/1997 | AuYeung et al. | |
| 6,055,252 A | 4/2000 | Zhang | |
| 6,353,623 B1 | 3/2002 | Munks et al. | |
| 6,377,068 B1 * | 4/2002 | Golden et al. | 326/26 |
| 6,400,737 B1 | 6/2002 | Broutin et al. | |
| 6,618,406 B1 * | 9/2003 | Kaminishi | 372/38.02 |
| 6,728,280 B1 * | 4/2004 | Tatum et al. | 372/43.01 |
| 2003/0152390 A1 | 8/2003 | Stewart et al. | |
| 2004/0114646 A1 | 6/2004 | Stewart et al. | |

OTHER PUBLICATIONS

"4-Channel Temperature Tunable 40 mW CW DFB Laser with Locker CQF474/708 Series." JDS Uniphase Product Bulletin. www.jdsu.com. 3 pgs.

"SFF-8053 Specification for GBIC (Gigabit Interface Converter)." SFF Committee. Sep. 27, 2000. www.schelto.com/t11_2/GBIC/sff-8053.pdf. 82 pgs.

"Small Form-factor Pluggable (SFP) Transceiver MulitSource Agreement (MSA)." www.schelto.com/SFP/SFP%20MSA.pdf. Sep.14, 2000 38 pgs.

* cited by examiner

Primary Examiner—Harvey Minsun
Assistant Examiner—Tuan N. Nguyen
(74) Attorney, Agent, or Firm—Workman Nydegger

(57) ABSTRACT

A circuit for equalizing transmission line loss of a laser drive signal includes a laser driver, a laser diode, and a transmission line for connecting the laser driver to the laser diode. The laser driver includes a differential pair of transistors, a modulation current source and two sets of source impedance circuits. Each set of source impedance circuits is configured to produce a frequency response for compensating the frequency response of the lossy transmission line at a distinct corresponding operating frequency. The set of source impedance circuits may be tuned to generate approximately zero impedance when the operating frequency is approximately zero. Hence a lower voltage power supply can be used to power both the laser driver and the laser diode, which in turn reduces the power consumption of the circuit.

20 Claims, 5 Drawing Sheets

METHOD AND SYSTEM FOR EQUALIZING TRANSMISSION LINE LOSS OF A LASER DRIVE SIGNAL

FIELD OF THE INVENTION

The present invention relates to the field of high-speed data communications. In particular, the invention relates to a circuit and method for equalizing transmission line loss of a laser drive signal. The invention further relates to a circuit and method for operating a laser driver circuit in a low power environment.

BACKGROUND OF THE INVENTION

FIG. 1A illustrates a prior art laser driver circuit. The laser driver circuit 100 preferably includes a differential pair of transistors 108 and 109 having gate terminals coupled to a pair of differential input signals, a drain terminal of transistor 108 coupled to a power supply, a current source ($I_{Mod}$) 110 coupled between source terminals of the differential pair of transistors 108 and 109 and a circuit ground, and an output port coupled to the anode of a laser diode 106. The output of the laser diode 106 is coupled to the drain terminal of the transistor 109. A bias current source 107 draws a DC bias current $I_{Bias}$ through the laser diode 106. The $I_{Bias}$ and $I_{Mod}$ determine the average optical output power generated by the laser diode 106, while the AC signal applied by the driver circuit 100 determines the instantaneous optical output power of the laser diode 106. The laser driver circuit 100 is placed in close proximity to the laser diode 106 to minimize transmission line side effects on the laser drive signal conveyed from the laser driver to the laser diode. The distance between the laser driver 100 and the laser diode 106 is preferably no more than one eighth of the shortest wavelength (i.e., $\lambda = c/(2\pi f)$, where f is the highest frequency of the laser drive signal) of the laser drive signal. For high speed data transmission applications (e.g., 10 Gb/s), this distance is on the order of less than a centimeter. However, if the driver circuit 100 is placed so close to the laser diode 106, the combined thermal energy emitted by the laser diode 106 and the laser driver 100 may exceed the thermal dissipation requirements of the integrate circuit package and the laser driver system.

FIG. 1B shows the optical power of a laser drive signal as a function of the current passing through the laser diode. The optical power emitted by the laser is directly related to the current passing through the laser diode 106. Referring to FIG. 1A, assuming that the differential input signals to the laser driver circuit 100 is balanced, half of the modulation current ($I_{Mod}$) 110 passes through transistor 108 and half passes through transistor 109. The bias current ($I_{Bias}$) 107 is selected to be high enough to keep the laser diode on even when a "zero" bit is being transmitted, with all the modulation current passing through transistor 108. The current through the laser diode modulates along the linear section of the curve with a midpoint around ($I_{Bias} + \frac{1}{2} I_{Mod}$).

FIG. 1C illustrates a laser driver circuit 102 and transmission line configuration for driving broadband signals to a laser diode 106. This circuit configuration allows the laser driver 102 and the laser diode 106 to be placed further apart, reducing or eliminating the aforementioned thermal problem. The laser driver 102 is preferably implemented by a differential pair of transistors 108 and 109 having drain terminals coupled to a power supply through a pair of impedance-matching resistors 112 and gate terminals coupled to a pair of differential input signals (In, $In_b$), a current source ($I'_{Mod}$) 110 for modulating current through the differential pair of transistors, and a pair of output ports coupled to the drain terminals of the differential pair of transistors 108 and 109. The pair of output ports are coupled to a pair of symmetrical signal paths connected to the P and N terminals of the laser diode 106. Each of these paths includes an AC-coupling capacitor 103, a lossy transmission line 104, and a load impedance $Z_{Load}$ 105 connected in series. The first signal path also includes a bias resistor $R_{Bias}$ 114 coupled between its lossy transmission line 104 and a power supply. The second signal path also includes a bias resistor $R_{Bias}$ 114 coupled between its lossy transmission line 104 and a bias current source ($I'_{Bias}$) 107. The laser diode 106 is biased by the bias current source 107.

One of the problems of the laser driver system illustrated in FIG. 1C is that as the frequency of the laser drive signal transmitted from the laser driver 102 to the laser diode 106 increases, the laser drive signal suffers higher signal attenuation in the lossy transmission lines 104. As a result the quality of the optical signal produced by the laser diode 106 decreases as the frequency of the input signal increases.

Another problem with the laser driver circuit of FIG. 1C is its high power consumption. The modulation current $I'_{Mod}$ 110 produces a voltage drop across the resistors 112. Because of the voltage drop across the resistors 112, a higher power supply voltage is required to drive the laser driver integrated circuit, which in turn translates into higher power consumption for the laser driver integrated circuit. Similarly, there is a voltage drop across the bias resistor 114 generated by the bias current $I'_{Bias}$. Because of the voltage drop across the resistor 114, a higher voltage power supply is required to drive the laser diode, which in turn translates into higher power consumption for the laser driver circuit.

In view of the shortcomings of the prior art, it is an objective of the present invention to provide a laser driver circuit that can compensate for the transmission line loss of a laser drive signal at a set of predetermined operating frequencies. Another objective is to provide a laser driver circuit with a low power consumption.

SUMMARY

A circuit for equalizing transmission line loss of a laser drive signal includes a laser driver, a laser diode, and a transmission line for connecting the laser driver to the laser diode. The laser driver includes a differential pair of transistors, a modulation current source and two sets of source impedance circuits. Each set of source impedance circuits has a first terminal coupled to a power supply and a second terminal coupled to a respective drain terminal of the differential pair of transistors and coupled to the transmission line. The set of source impedance circuits is configured to produce a frequency response that compensates for the frequency response of the lossy transmission line over a predefined range of operating frequencies. In addition, the set of source impedance circuits generate approximately zero impedance when the operating frequency is approximately zero. Hence a lower voltage power supply can be used to power both the laser driver and the laser diode, which in turn reduces the power consumption of the circuit.

BRIEF DESCRIPTION OF THE DRAWINGS

The aforementioned features and advantages of the invention as well as additional features and advantages thereof will be more clearly understood hereinafter as a result of a detailed description of embodiments of the invention when taken in conjunction with the following drawings.

DESCRIPTION OF EMBODIMENTS

Figure 2A:
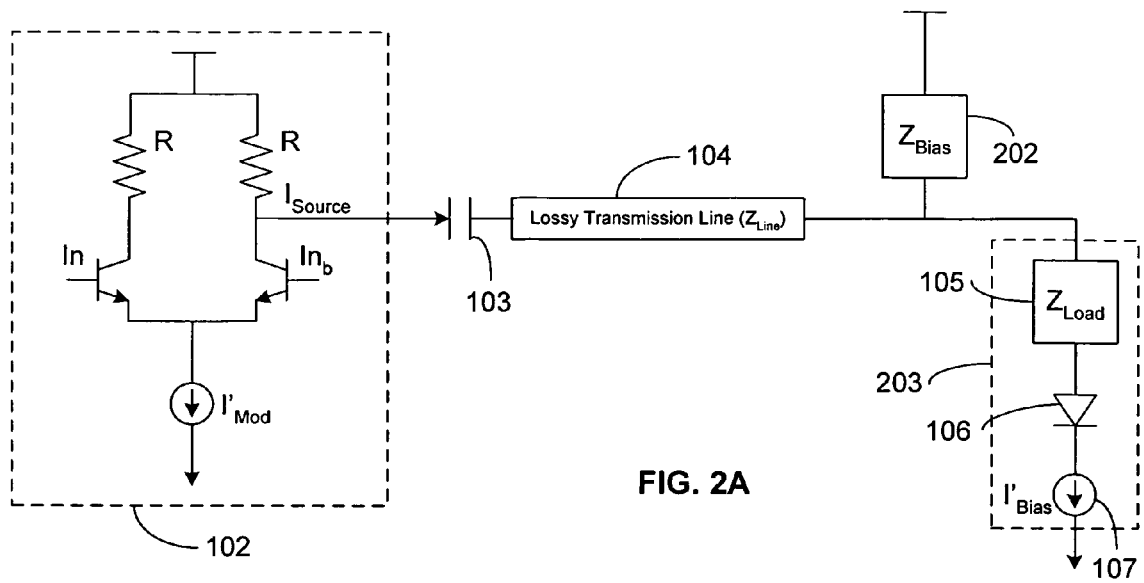
FIG. 2A illustrates a circuit for equalizing transmission line loss of a laser drive signal.

FIG. 2A illustrates a circuit for equalizing transmission line loss of a laser drive signal in accordance with an embodiment of the present invention. The circuit includes a laser driver 102, an AC-coupling capacitor 103, a lossy transmission line 104, a set of bias impedance circuits $Z_{Bias}$ 202, and a laser diode circuit 203. The set of bias impedance circuits $Z_{Bias}$ 202 have a first terminal coupled to a power supply and a second terminal coupled to the transmission line. The laser diode circuit 203 includes a load impedance $Z_{Load}$ 205, a laser diode 106 and a bias current $I'_{Bias}$ 107.

Figure 2B:
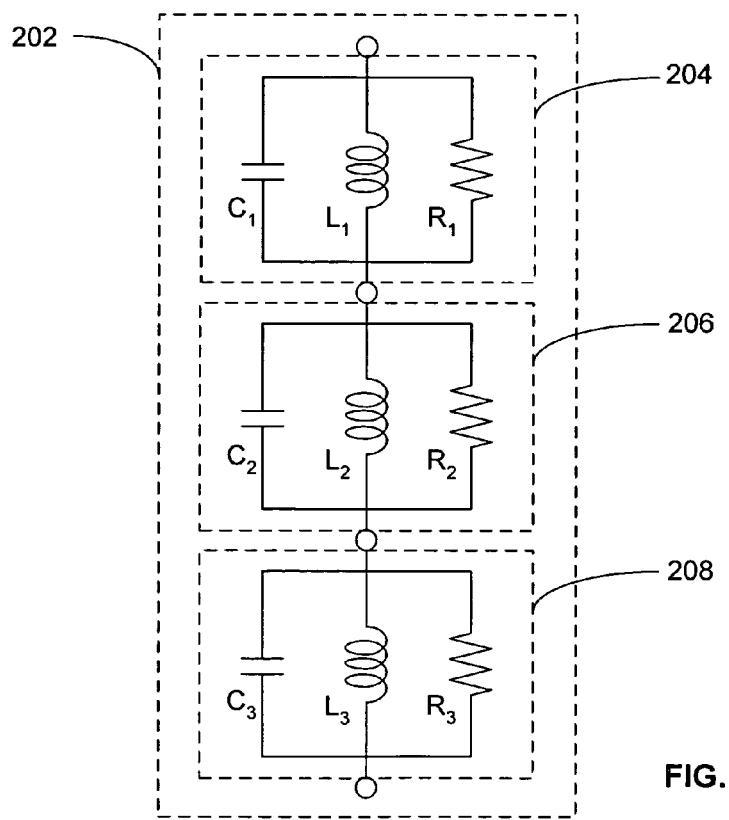
FIG. 2B illustrates an embodiment of the set of bias impedance circuits of FIG. 2A.

FIG. 2B illustrates an embodiment of the set of bias impedance circuits of FIG. 2A. The set of bias impedance circuits $Z_{Bias}$ preferably includes one or more frequency dependent impedance circuits, such as circuits 204, 206 and 208, connected in series. Each frequency dependent impedance circuit preferably includes a resistor, an inductor and a capacitor connected in parallel. For instance, the frequency dependent impedance circuit 204 includes the resistor $R_1$, the inductor $L_1$ and the capacitor $C_1$ connected in parallel. Likewise, the frequency dependent impedance circuit 206 includes the resistor $R_2$, the inductor $L_2$ and the capacitor $C_2$ connected in parallel. And the frequency dependent impedance circuit 208 includes the resistor $R_3$, the inductor $L_3$, and the capacitor $C_3$ connected in parallel.

Each frequency dependent impedance circuit produces a desired impedance at a distinct corresponding operating frequency. The operating frequency of each respective frequency dependent impedance circuit is a resonance frequency of the respective frequency dependent impedance circuit. For example, $L_1$ and $C_1$ resonate at a low operating frequency $F_1$, $L_2$ and $C_2$ resonate at a medium operating frequency $F_2$, and $L_3$ and $C_3$ resonate at a high operating frequency $F_3$, where $F_3 > F_2 > F_1$. The resistor of each respective frequency dependent impedance circuit defines the impedance of that circuit at its resonant frequency. For example, $R_1$ has a low resistance value, $R_2$ has a medium resistance value, and $R_3$ has a high resistance value, where $R_3 > R_2 > R_1$.

Figure 2C:
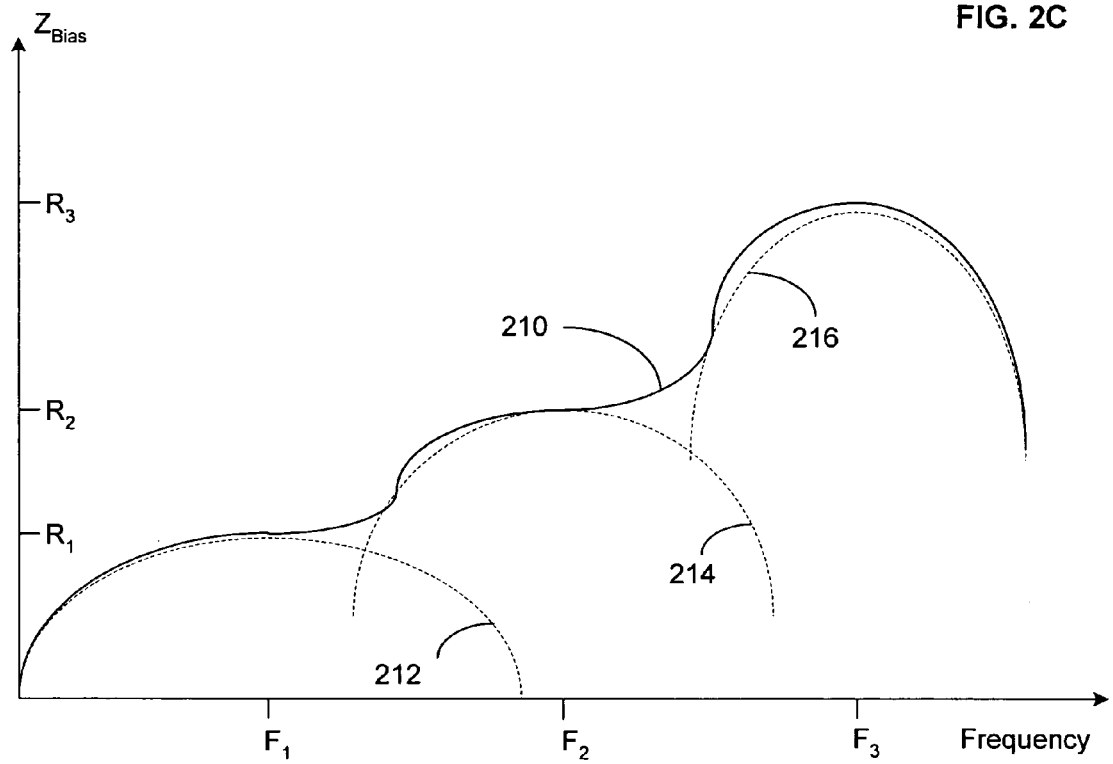
FIG. 2C is a graph showing the impedance of the set of bias impedance circuits in FIG. 2B as a function of frequency.

FIG. 2C is a graph showing the overall bias impedance of the set of bias impedance circuits of FIG. 2B as a function of frequency. Each frequency dependent impedance circuit 204, 206 and 208 produces an impedance at a certain frequency, represented by the corresponding dotted-line curve 212, 214 and 216 respectively. The frequency response for each frequency dependent impedance circuit 204, 206 and 208 may also be expressed by the equation $Fi = 1/2\pi mt;epmrl;,/LiCirlxmx$, where i equals to 1, 2, or 3 respectively. The overall impedance 210 is the sum of each frequency dependent impedance circuit 204, 206 and 208.

The dotted-line curve 212 illustrates the frequency response of bias impedance circuit 204. At near DC frequency, the capacitors $C_1$, $C_2$, and $C_3$ are practically open circuits, and the inductors $L_1$, $L_2$, and $L_3$ are practically short circuits. The resistance of the inductors $L_1$, $L_2$, and $L_3$ dominates the resistance of the parallel resistors $R_1$, $R_2$, and $R_3$. The overall impedance of $Z_{Bias}$ 202 is approximately zero. In the operating frequency range between zero and $F_1$, as the operating frequency increases, the impedance of the inductor $L_1$ increases but the impedance of the capacitor $C_1$ decreases. The impedance of $L_1$ dominates because it is the lowest among its parallel counterparts $R_1$ and $C_1$. The combined impedance of $R_1$, $L_1$ and $C_1$ increases as the operating frequency increases. In the operating frequency range around frequency $F_1$, the frequency dependent impedance circuit 204 resonates, causing the combination of $L_1$ and $C_1$ to operate like an open circuit. The impedance of $R_1$ dominates and thus the impedance of circuit 204 at frequency $F_1$ is approximately $R_1$. In the operating frequency range higher than $F_1$, the impedance of capacitor C1 further decreases while the impedance of the inductor further increases. The impedance of $C_1$ dominates because it is the lowest among its parallel counterparts $R_1$ and $L_1$. The combined impedance of $R_1$, $L_1$ and $C_1$ decreases as the frequency increases beyond $F_1$.

The frequency response for the frequency dependent impedance circuits 206 and 208 are shown in dotted-lines 214 and 216, respectively. The analysis of frequency dependent impedance circuits 206 and 208 is similar to that of the frequency dependent impedance circuit 204. For instance, at the operating frequency of $F_2$, $L_2$ and $C_2$ of circuit 206 resonate and the overall impedance of the $Z_{bias}$ 202 is approximately equal to $R_2$. Similarly, at the operating frequency of $F_3$, $L_3$ and $C_3$ of circuit 208 resonate and the overall impedance of the $Z_{bias}$ 202 is approximately equal to $R_3$.

Note that the overall $Z_{Bias}$ 202 can be shaped to produce virtually any desired impedance at a particular frequency. Hence a desired frequency response of the $Z_{Bias}$ can be produced to compensate for the frequency response of the lossy transmission line 104 (FIG. 2A). As a result, the circuit as shown in FIG. 2A can produce a laser drive signal having a certain frequency response to satisfy a desired signal quality at a set of predetermined operating frequencies. Also note that the width of the frequency response curves 212, 214 and 216 is inversely proportional to the resistance value of the corresponding resistors $R_1$, $R_2$ and $R_3$. The lower the resistance value, the flatter is the frequency response curve. The higher the resistance value, the sharper is the frequency response curve. For example, the resistance of $R_1$ is relatively low, and therefore the frequency response curve 212 of the corresponding frequency dependent impedance circuit 204 is relatively flat. The resistance of $R_3$ is higher than $R_1$, and therefore the frequency response curve 216 of the corresponding frequency dependent circuit 208 is sharper than the frequency response curve of circuit 204.

Figure 2D:
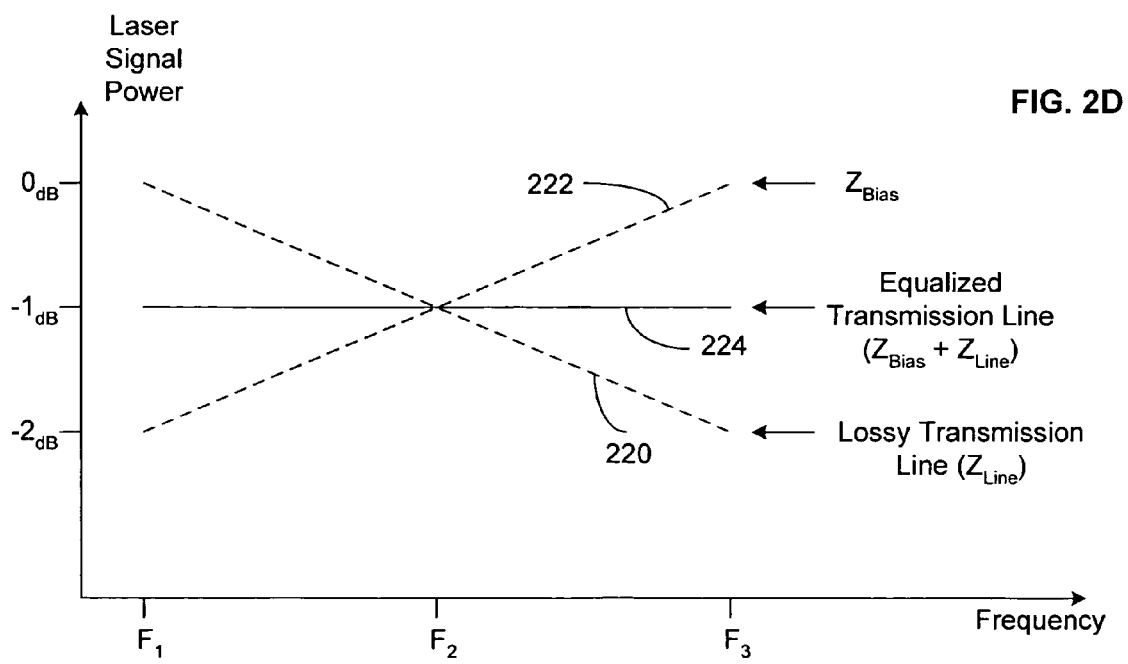
FIG. 2D illustrates the effect of equalizing the frequency response of the lossy transmission line using the set of bias impedance circuits.

FIG. 2D illustrates the effect of equalizing the frequency response of the lossy transmission line. In FIG. 2D, the dotted line 220 represents the frequency response of the lossy transmission line prior to equalization. As the operating frequency of the laser drive signal increases, higher attenuation is suffered by the laser drive signal through the lossy transmission line. For example, at frequency $F_1$, the laser drive signal power is at 0 dB. At frequency $F_2$, the laser drive signal suffers 1 dB signal loss. And at frequency $F_3$, the laser drive signal suffers 2 dB of signal loss. Without equalizing the frequency response of the transmission line, when the laser driver 102 drives a source current to the laser diode circuit through the lossy transmission line, portions of the source current go to the $Z_{Bias}$ 202 and other portions of the source current go to the laser diode circuit 203. But if both $Z_{Bias}$ and $Z_{Load}$ impedances are flat in frequency response and the transmission line is lossy in frequency response, the overall frequency response of the laser drive signal path is lossy. Therefore, without equalization, the signal quality of the laser degrades as the frequency increases, which is undesirable.

The dotted line 222 illustrates the frequency response of the set of bias impedance circuits used to equalize the lossy transmission line. At lower frequency, the frequency dependent impedance circuits 204, 206 and 208 generate a low impedance. Thus, a larger portions of the source current are directed to the $Z_{Bias}$ and a smaller portions of the source current are directed to the laser diode circuit, which results in lower laser drive signal power. As the operating frequency increases, the impedance of $Z_{Bias}$ increases and proportionally smaller portions of the source current are directed to the $Z_{Bias}$ and larger portions of the source current are directed to the laser diode circuit. The combined frequency response of the $Z_{Bias}$ and the lossy transmission line is flat, or at least approximately flat, represented by the solid line 224 of post-equalized lossy transmission line ($Z_{Bias}+Z_{Line}$).

In one embodiment, the impedance of the $Z_{Bias}$ is tuned such that its frequency response is approximately inversely related to the frequency response of the lossy transmission line. In addition, the value of the resistors $R_1$, $R_2$ and $R_3$ are tuned to balance the tradeoff between the efficiency of the laser driver circuit and the quality of the laser drive signal. If the value of the resistors are high, a larger portion of the source current driven from the laser driver 102 is directed to the laser diode circuit 203, which makes the circuit more efficient. On the other hand, as explained above, if the values of the resistors are high, the frequency response of the frequency dependent impedance circuits are sharper, which produces larger variations in the frequency response of the $Z_{Bias}$ circuit, which leads to lower signal quality.

Figure 1A:
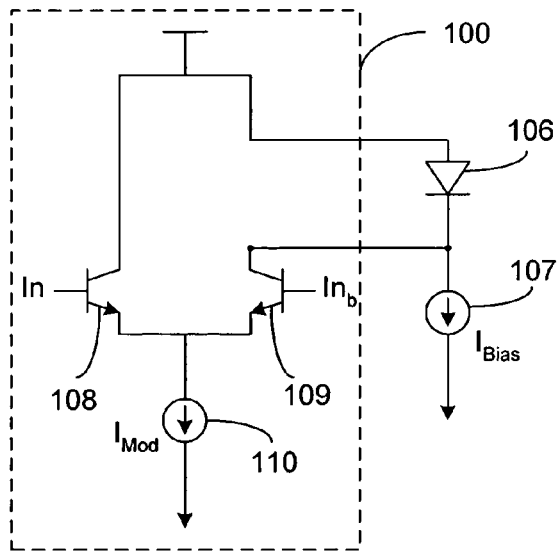
FIG. 1A illustrates a prior art laser driver circuit.
Figure 1B:
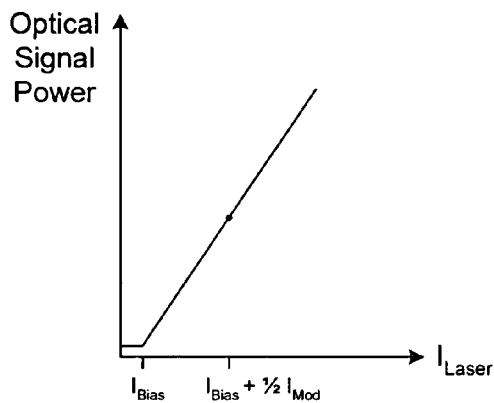
FIG. 1B shows the optical output power of a laser diode as a function of the current passing through the laser diode.
Figure 1C:
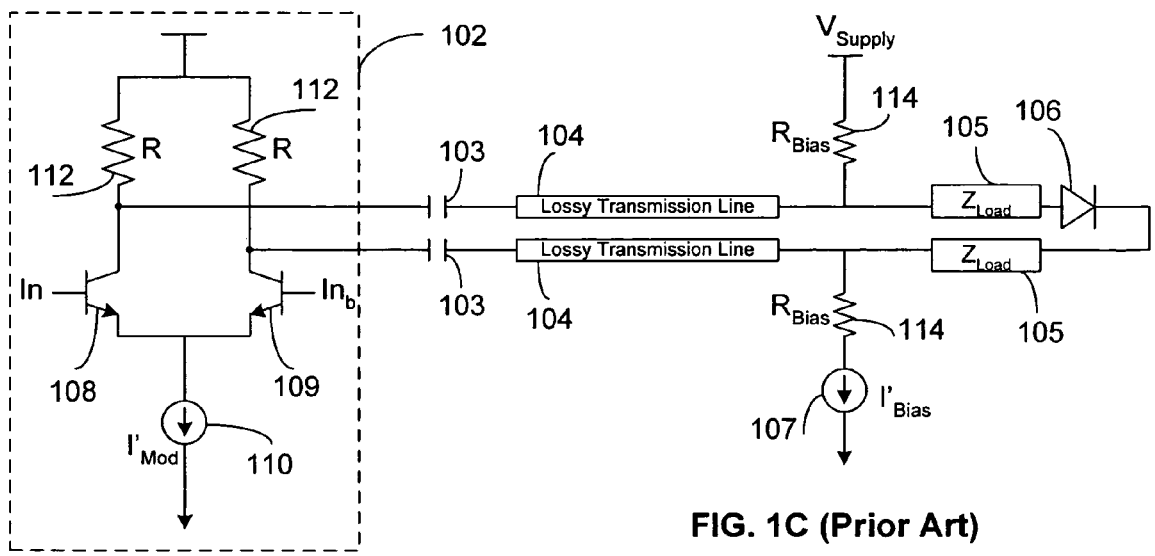
FIG. 1C illustrates a laser driver circuit for driving broadband laser drive signals.

The circuit of FIG. 2A provides at least two improvements over the prior art circuit shown in FIG. 1C. First, it generates a higher quality laser drive signal because of the equalization of the lossy frequency response of the transmission line. Second, the circuit consumes less power as the laser diode circuit can be powered by a lower voltage power supply. A lower voltage power supply can be used because there is virtually no DC voltage drop across the $Z_{Bias}$ as the impedance of the $Z_{Bias}$ is approximately zero at near DC frequency. Thus the power consumption of the laser diode circuit is reduced.

Figure 3A:
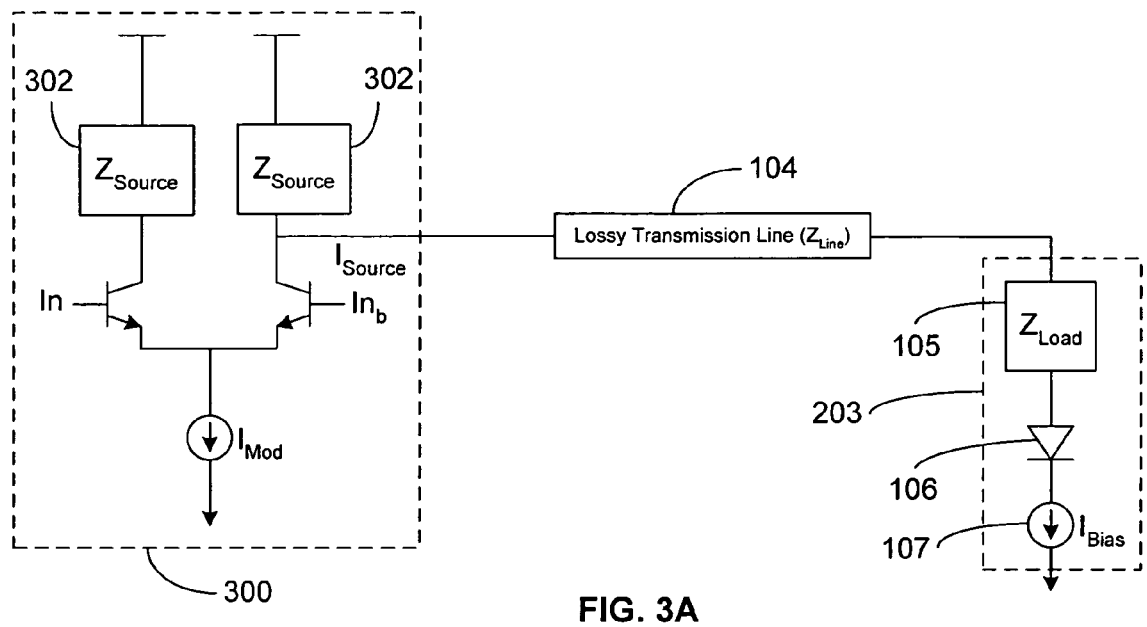
FIG. 3A illustrates an improvement of the laser driver circuit of FIG. 2A.

FIG. 3A illustrates a further improvement of the laser driver circuit of FIG. 2A in accordance with another embodiment. The circuit includes a laser driver 300, a lossy transmission line 104, and a laser diode circuit 203. The laser driver 300 is similar to the laser driver 102 of FIG. 2A except that 1) the pair of resistors 112 is replaced by two sets of source impedance circuits 302; 2) the set of bias impedance circuits 202 is removed; and 3) the AC-coupling capacitor 103 is removed.

Figure 3B:
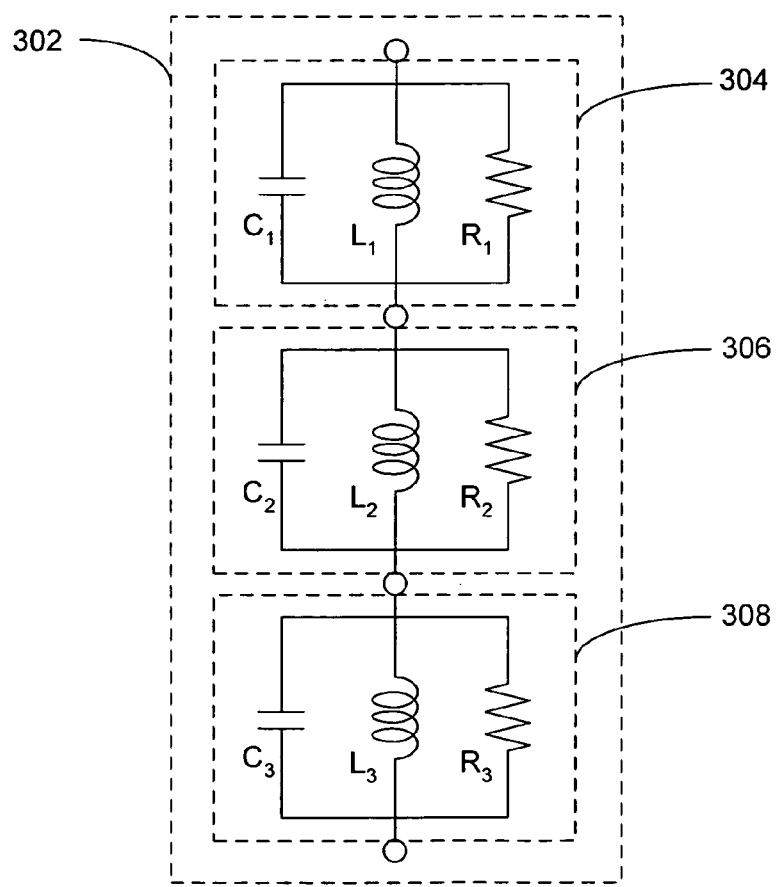
FIG. 3B illustrates an embodiment of the set of source impedance circuits of FIG. 3A.

FIG. 3B illustrates an embodiment of the set of source impedance circuits of FIG. 3A. Similar to the set of bias impedance circuits $Z_{Bias}$ 202 of FIG. 2A, each set of source impedance circuits $Z_{Source}$ 302 includes a set of frequency dependent impedance circuits, such as 304, 306 and 308, connected in series. Each frequency dependent impedance circuit preferably includes a resistor, an inductor and a capacitor connected in parallel. In addition, each frequency dependent impedance circuit produces a desired impedance at a distinct corresponding operating frequency. The operating frequency of each respective frequency dependent impedance circuit is a resonance frequency of the respective frequency dependent impedance circuit. The electrical characteristic of the set of source impedance circuits 302 is similar to that of the set of bias impedance circuits 202, which is described above with reference to FIG. 2B.

Figure 3C:
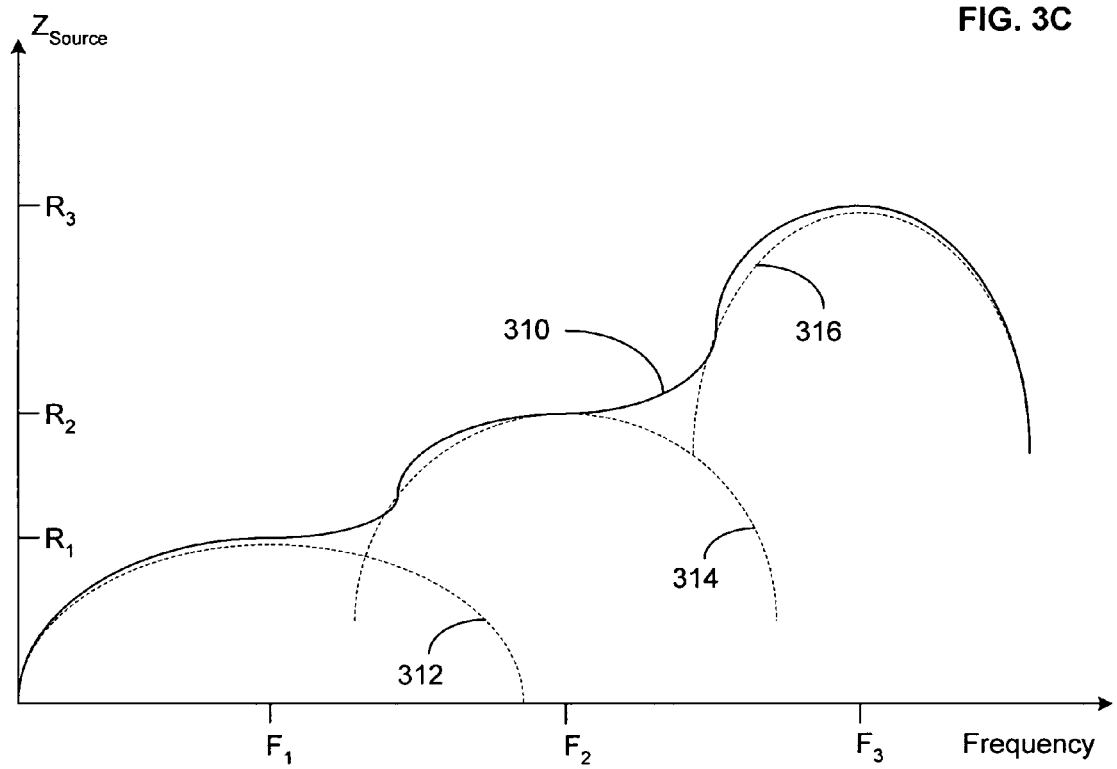
FIG. 3C is a graph showing the impedance of the set of source impedance circuits in FIG. 3B as a function of frequency.

FIG. 3C is a graph showing the overall impedance of the set of source impedance circuits of FIG. 3B as a function of frequency. Each frequency dependent impedance circuit 304, 306 and 308 produces an impedance at a certain frequency, represented by the corresponding dotted-line curve 312, 314 and 316 respectively. The frequency response for each frequency dependent impedance circuit 304, 306 and 308 may also be expressed by the equation $Fi=\frac{1}{2}\pi mt;epmrl;\sqrt{LiCi}rlxmx$, where i equals to 1, 2, or 3 respectively. The overall impedance 310 is the sum of the frequency dependent impedances of circuits 304,306 and 308. Since the set of source impedance circuits $Z_{Source}$ 302 has the same electrical characteristic as the set of bias impedance circuits $Z_{Bias}$ 202, its frequency responses also behaves similarly to the set of bias impedance circuits, which is described above with reference to FIG. 2C. For example, at near DC frequency, the capacitors $C_1$, $C_2$, and $C_3$ are practically open circuits, and the inductors $L_1$, $L_2$, and $L_3$ are practically short circuits. The resistance of the inductors $L_1$, $L_2$, and $L_3$ dominates the resistance of the parallel resistors $R_1$, $R_2$, and $R_3$ a frequencies near zero. The overall impedance Of $Z_{Bias}$ 202 is approximately zero at zero frequency. Note that since there is no voltage drop across the $Z_{Source}$ 302 as the impedance of the $Z_{Source}$ 302 is approximately zero at near DC frequency, the laser driver circuit can utilize a lower voltage power supply which in turn translates into power savings by the laser driver circuit.

Note that the overall impedance of $Z_{Source}$ 302 can be shaped to produce virtually any desired impedance at a particular frequency. Hence a desired frequency response of the $Z_{Source}$ 302 can be produced to compensate for the frequency response of the lossy transmission line 104. As a result, the circuit shown in FIG. 3A can produce a laser drive signal having a certain frequency response to satisfy a desired signal quality at a set of predetermined operating frequencies. Also note that the width of the frequency response curves 312, 314 and 316 is inversely proportional to the resistance value of the corresponding resistors $R_1$, $R_2$ and $R_3$. The lower the resistance value, the flatter is the frequency response curve. The higher the resistance value, the sharper is the frequency response curve.

Figure 3D:
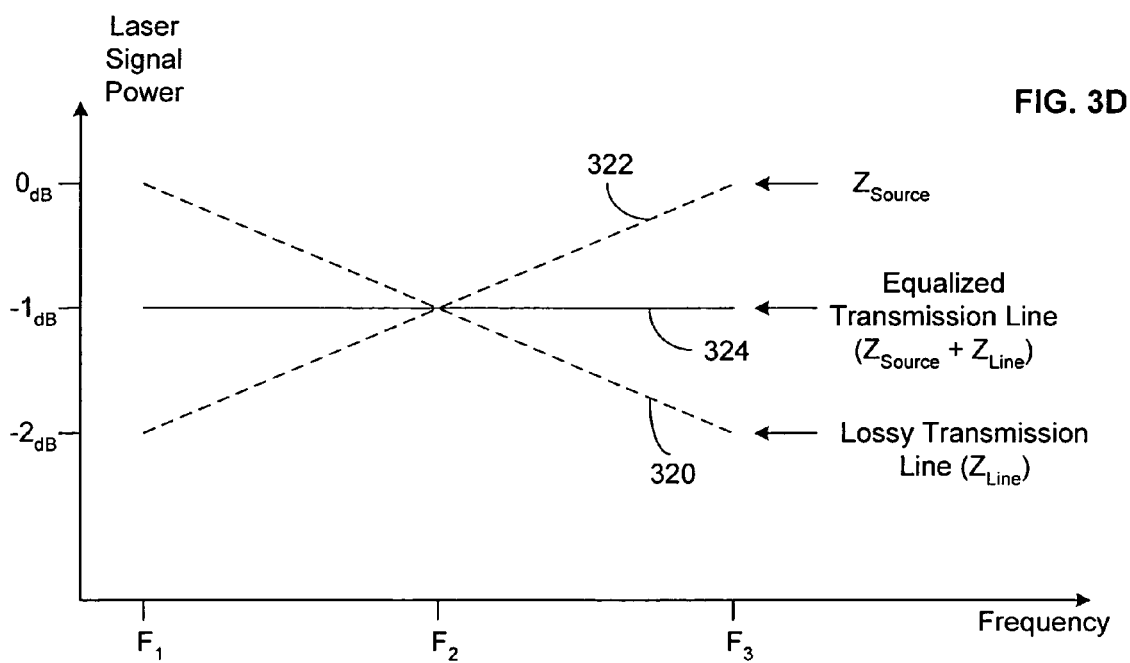
FIG. 3D illustrates the effect of equalizing the frequency response of the lossy transmission line using the set of source impedance circuits.

FIG. 3D illustrates the effect of equalizing the frequency response of the lossy transmission line 104 by using the set of source impedance circuits $Z_{Source}$ 302. In FIG. 3D, the dotted line 320 illustrates the frequency response of the power of a laser drive signal prior to equalization. The dotted line 322 illustrates the frequency response of the set of source impedance circuits $Z_{Source}$ 302 used to equalized the frequency response of the lossy transmission line. And the solid line 324 illustrates the resultant frequency response of the signal path after equalization. Since the set of source impedance circuits $Z_{Source}$ 302 has similar electrical characteristic to the set of bias impedance circuits $Z_{Bias}$ 202, its frequency responses also behaves similarly to the set of bias impedance circuits $Z_{Bias}$ 202, which is described above with reference to FIG. 2D.

The circuit of FIG. 3A provides further improvements over the circuit shown in FIG. 2A. First, the circuit applies the power saving technique of FIG. 2A to the laser driver integrated circuit. Since there is no voltage drop across the $Z_{Source}$ 302 at near DC frequency (because the impedance of the $Z_{Source}$ 302 is approximately zero), the laser driver chip can utilize a lower voltage power supply and therefore the overall power consumption of the laser driver chip is reduced. Second, this circuit eliminates the $Z_{Bias}$ 202 impedance circuits, which reduces the number of components used and reduces system cost.

One skilled in the relevant art will recognize that there are many possible modifications of the disclosed embodiments that could be used, while still employing the same basic underlying mechanisms and methodologies. For example, a different number of frequency dependent impedance circuits can be used, different types of transistors can be used to implement the laser driver circuit, and different values of the resistor, inductor and capacitor can be used to shape the frequency response waveform of the set of bias impedance circuits and the set of source impedance circuits.

The foregoing description, for purpose of explanation, has been described with reference to specific embodiments. However, the illustrative discussions above are not intended to be exhaustive or to limit the invention to the precise forms disclosed. Many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated.

What is claimed is:

1. A method for compensating transmission line loss of a laser drive signal, comprising:
providing a transmission line between a laser driver circuit and a laser diode, the transmission line having coupled thereto a set of frequency dependent impedance circuits connected in series, each frequency dependent impedance circuit comprising a resistor, an inductor and a capacitor connected in parallel, and each frequency dependent impedance circuit is configured to produce a desired impedance at the corresponding frequency, the set of frequency dependent impedance circuits corresponding to a predefined set of operating frequencies of the laser drive signal, wherein each frequency dependent impedance circuit of the set of frequency dependent impedance circuits is configured to generate a frequency response that compensates for the laser drive signal loss of the transmission line at a distinct corresponding operating frequency, and wherein; and
driving the laser drive signal from the laser driver circuit to the laser diode through the transmission line, the laser drive signal operating within a range of frequencies associated with the predefined set of operating frequencies.

2. The method of claim 1, wherein the laser driver circuit comprises:
a differential pair of transistors having drain terminals coupled to a power supply and gate terminals coupled to a pair of differential input signals;
a current source coupled between source terminals of the differential pair of transistors and a circuit ground; and
a pair of output ports coupled to the drain terminals of the differential pair of transistors.

3. The method of claim 1, wherein the set of frequency dependent impedance circuits is configured to produce a substantially zero impedance when the operating frequency is approximately zero and is further configured to produce a predetermined non-zero impedance at each operating frequency of a predetermined set of operating frequencies.

4. The method of claim 1, wherein the operating frequency of each respective frequency dependent impedance circuit is a resonance frequency of the respective frequency dependent impedance circuit.

5. The method of claim 1, wherein the resistor of each respective frequency dependent impedance circuit is tuned to optimize the efficiency of the laser driver circuit and the quality of the laser drive signal in accordance with a set of predetermined system design criteria.

6. A circuit for compensating transmission line loss of a laser drive signal, comprising:
a laser driver circuit;
a laser diode;
a transmission line connecting the laser driver circuit to the laser diode; and
a set of frequency dependent impedance circuits connected in series, each frequency dependent impedance circuit comprising a resistor, an inductor and a capacitor connected in parallel, and each frequency dependent impedance circuit is configured to produce a desired impedance at the corresponding frequency, the set of frequency dependent impedance circuits, the set of frequency dependent impedance circuits having a first terminal coupled to a power supply and a second terminal coupled to the transmission line, wherein each frequency dependent impedance circuit of the set of frequency dependent impedance circuits is configured to generate a frequency response that compensates for laser drive signal loss of the transmission line at a distinct corresponding operating frequency.

7. The circuit of claim 6, wherein the laser driver circuit comprises:
a differential pair of transistors having drain terminals coupled to a power supply and gate terminals coupled to a pair of differential input signals;
a current source coupled between source terminals of the differential pair of transistors and a circuit ground; and
a pair of output ports coupled to the drain terminals of the differential pair of transistors.

8. The circuit of claim 6, wherein the set of frequency dependent impedance circuits is configured to produce a substantially zero impedance when the operating frequency is approximately zero and is further configured to produce a predetermined non-zero impedance at each operating frequency of a predetermined set of operating frequencies.

9. The circuit of claim 6, wherein the operating frequency of each respective frequency dependent impedance circuit is a resonance frequency of the respective frequency dependent impedance circuit.

10. The circuit of claim 6, wherein the resistor of each respective frequency dependent impedance circuit is tuned to optimize the efficiency of the laser driver circuit and the quality of the laser drive signal in accordance with a set of predetermined system design criteria.

11. A method for operating a laser driver circuit, wherein the laser driver circuit drives a laser drive signal to a laser diode through a transmission line, comprising:

providing a laser driver circuit that comprises:

a differential pair of transistors having each drain terminal coupled to a power supply through a set of source impedance circuits and gate terminals coupled to a pair of differential input signals, wherein the set of source impedance circuits produces a substantially zero impedance when the operating frequency is approximately zero and produces a predetermined non-zero impedance at each operating frequency of a predefined set of operating frequencies, and wherein the differential input signals operate within a range of frequencies associated with the predefined set of operating frequencies;

a current source coupled between source terminals of the differential pair of transistors and a circuit ground; and a pair of output ports coupled to the drain terminals of the differential pair of transistors; and driving the laser driver circuit with an input signal, the input signal operating within a range of frequencies associated with the predefined set of operating frequencies.

12. The method of claim 11, wherein the set of source impedance circuits comprises a set of frequency dependent impedance circuits connected in series; each frequency dependent impedance circuit comprises a resistor, an inductor and a capacitor connected in parallel; and each frequency dependent impedance circuit is configured to produce the predetermined impedance at the corresponding operating frequency.

13. The method of claim 12, wherein the operating frequency of each respective frequency dependent impedance circuit is a resonance frequency of the respective frequency dependent impedance circuit.

14. The method of claim 12, wherein the resistor of each respective frequency dependent impedance circuit is tuned to optimize the efficiency of the laser driver circuit and the quality of the laser drive signal in accordance with a set of predetermined system design criteria.

15. The method of claim 11, wherein the set of source impedance circuits is configured to generate a frequency response that compensates for the laser drive signal loss due to the frequency response of the transmission line at a distinct corresponding operating frequency.

16. A laser driver circuit, wherein the laser driver circuit drives a laser drive signal to a laser diode through a transmission line, comprising:

a differential pair of transistors having each drain terminal coupled to a power supply through a set of source impedance circuits and gate terminals coupled to a pair of differential input signals, wherein the set of source impedance circuits produces a substantially zero impedance when the operating frequency is approximately zero and produces a predetermined non-zero impedance at each operating frequency of a predefined set of operating frequencies, and wherein the differential input signals operate within a range of frequencies associated with the predefined set of operating frequencies;

a current source coupled between source terminals of the differential pair of transistors and a circuit ground; and a pair of output ports coupled to the drain terminals of the differential pair of transistors.

17. The laser driver circuit of claim 16, wherein the set of source impedance circuits comprises a set of frequency dependent impedance circuits connected in series, each frequency dependent impedance circuit comprises a resistor, an inductor and a capacitor connected in parallel, and each frequency dependent impedance circuit produces the predetermined impedance at the corresponding operating frequency.

18. The laser driver circuit of claim 17, wherein the operating frequency of each respective frequency dependent impedance circuit is a resonance frequency of the respective frequency dependent impedance circuit.

19. The laser driver circuit of claim 17, wherein the resistor of each respective frequency dependent impedance circuit is tuned to optimize the efficiency of the laser driver circuit and the quality of the laser drive signal in accordance with a set of predetermined system design criteria.

20. The laser driver circuit of claim 16, wherein the set of source impedance circuits is configured to generate a frequency response that compensates for the laser drive signal loss due to the frequency response of the transmission line at a distinct corresponding operating frequency.

* * * * *

UNITED STATES PATENT AND TRADEMARK OFFICE
CERTIFICATE OF CORRECTION

PATENT NO. : 7,054,344 B1
APPLICATION NO. : 10/716745
DATED : May 30, 2006
INVENTOR(S) : Nguyen It is certified that error appears in the above-identified patent and that said Letters Patent is hereby corrected as shown below:

Title Page
Item 56, References Cited, Other Publications, Reference 3, Line 2, change "MulitSource" to --MultiSource--

Column 1
Line 50, change "is" to --are--

Column 3
Line 42, change "205" to --105--

Column 4
Line 9, change "curve" to --curves--
Line 12, change "Fi=½πmt;epmrl;√LiCirlxmx" to --Fi=1/2π $\sqrt{LiCi}$ --
Line 12, remove [to]
Line 34, change "C1" to --$C_1$--

Column 5
Line 29, remove [a]
Line 30, remove [a]

Column 6
Line 3, remove [112]
Line 28, change "curve" to --curves--
Line 31, change "Fi=½πmt;epmrl;√LiCirlxmx" to --Fi=1/2π $\sqrt{LiCi}$ --
Line 31, remove [to]
Line 43, remove [a frequencies near zero]
Line 44, change "Of" to --of--
Line 44, change "$Z_{Bias}$ 202" to --$Z_{Source}$ 302--

Column 7
Lines 64-65, remove [and wherein]

UNITED STATES PATENT AND TRADEMARK OFFICE
CERTIFICATE OF CORRECTION

PATENT NO. : 7,054,344 B1
APPLICATION NO. : 10/716745
DATED : May 30, 2006
INVENTOR(S) : Nguyen It is certified that error appears in the above-identified patent and that said Letters Patent is hereby corrected as shown below:

Column 8
Lines 39-40, remove [the set of frequency dependent impedance circuits,]

Signed and Sealed this

Nineteenth Day of August, 2008

JON W. DUDAS
*Director of the United States Patent and Trademark Office*